US008615870B1

(12) United States Patent
Neu et al.

(10) Patent No.: US 8,615,870 B1
(45) Date of Patent: Dec. 31, 2013

(54) METHOD FOR INSTALLING CRUISE CONTROL STOP SWITCH

(75) Inventors: Michael Neu, Oxford, AL (US); Danny Parks, Vincent, AL (US); David McCoy, Leeds, AL (US)

(73) Assignee: Honda Motor Co., Ltd., Tokyo (JP)

( * ) Notice: Subject to any disclaimer, the term of this patent is extended or adjusted under 35 U.S.C. 154(b) by 1091 days.

(21) Appl. No.: 12/612,939

(22) Filed: Nov. 5, 2009

(51) Int. Cl.
*G01R 31/327* (2006.01)
*H05K 13/00* (2006.01)

(52) U.S. Cl.
USPC ............... 29/758; 29/739; 324/556

(58) Field of Classification Search
USPC ............. 29/729, 705, 754, 758; 324/555, 556
See application file for complete search history.

(56) References Cited

U.S. PATENT DOCUMENTS

| 1,905,668 A | 4/1933 | White |
| 4,536,705 A | 8/1985 | Hayes |
| 4,777,479 A | 10/1988 | Hinckley |
| 4,839,599 A * | 6/1989 | Fischer .......................... 324/542 |
| 5,604,439 A | 2/1997 | Walkington et al. |
| 5,889,246 A | 3/1999 | Frank et al. |
| 6,437,580 B1 * | 8/2002 | Gale ............................. 324/555 |
| 6,731,217 B1 | 5/2004 | Warner |
| 6,900,641 B2 | 5/2005 | Draggie et al. |
| 6,982,558 B2 | 1/2006 | Bryndzia et al. |
| 7,385,519 B2 | 6/2008 | Weems, II |

FOREIGN PATENT DOCUMENTS

| GB | 2005428 | 4/1979 |
| GB | 2115563 | 9/1983 |

* cited by examiner

*Primary Examiner* — Livius R Cazan
(74) *Attorney, Agent, or Firm* — Rankin Hill & Clark LLP

(57) ABSTRACT

An installation tool to install a cruise control stop switch onto a brake pedal of an automotive vehicle includes a cylindrical shaped main body, a cylindrical shaped top portion attached to an open end of the main body, a power supply enclosed within the main body and the top portion, multiple indicators attached to an outer surface of the main body, and a removable coupler located in a recess in the top portion. The coupler, which is electrically connected to the power source and the multiple indicators, is configured to receive the cruise control stop switch.

3 Claims, 4 Drawing Sheets

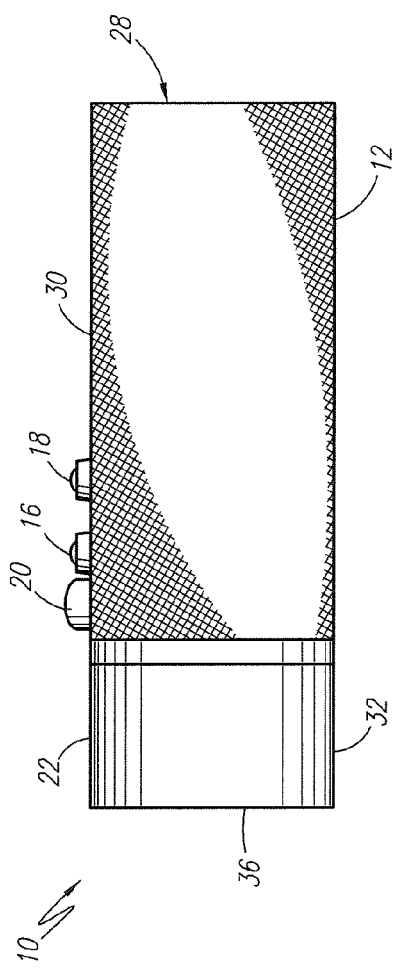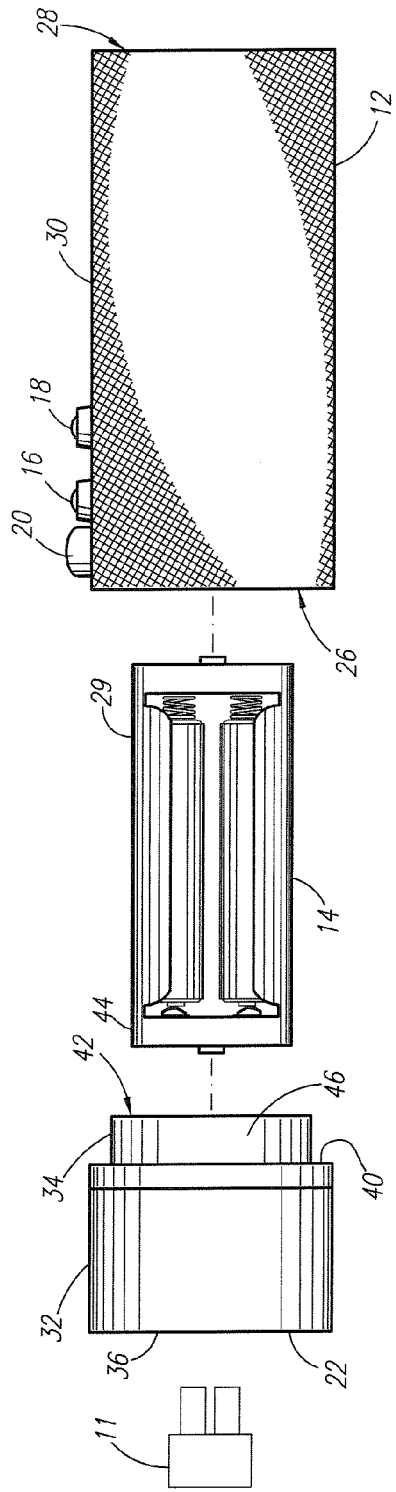

METHOD FOR INSTALLING CRUISE CONTROL STOP SWITCH

BACKGROUND

The present invention relates to an installation tool for an automotive vehicle and more specifically to a tool for installing a cruise control stop switch on a brake pedal of the automotive vehicle. Cruise control stop switches are common on all types of vehicles equipped with cruise control. The cruise control stop switch is an adjustable switch to accommodate the many different brake designs in the automotive industry. Because there are so many different brake designs there exists a possibility that the cruise control stop switch will be installed incorrectly. Thus, what is required is a device to ensure that the cruise control stop switch is installed correctly.

SUMMARY

In accordance with one aspect, an installation tool to install a cruise control stop switch onto a brake pedal of an automotive vehicle is provided that overcomes the above mentioned disadvantages. The installation tool includes a cylindrical shaped main body having an open end and a closed end, a cylindrical shaped top portion removably attached to the open end of the main body, a power supply enclosed within the main body and the top portion, a plurality of indicators attached to an outer surface of the main body, and a removable coupler located in a recess in the top portion and electrically connected to the power source and the plurality of indicators, the removable coupler being configured to receive the cruise control stop switch.

BRIEF DESCRIPTION OF THE DRAWINGS

FIG. 3 is a side assembled view of the cruise control stop switch installation tool of FIG. 1.

FIG. 4 is an exploded side view of the cruise control stop switch installation tool of FIG. 1.

DETAILED DESCRIPTION

Figure 1:
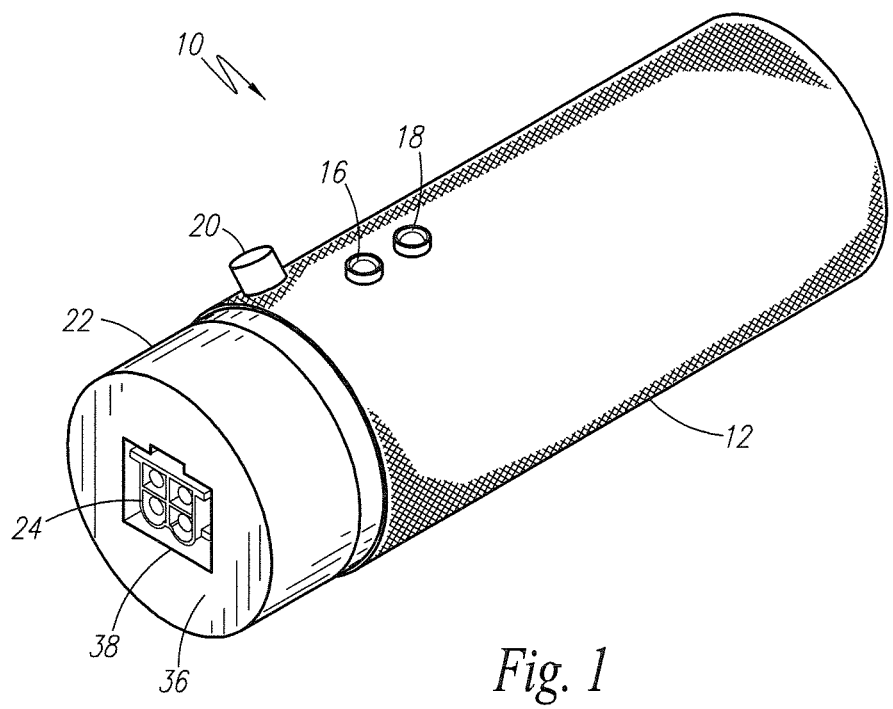
FIG. 1 is a perspective view of a cruise control stop switch installation tool.

Referring now to the drawings, FIGS. 1-4 show an example embodiment of a cruise control stop switch installation system comprising an installation tool 10 (hereinafter "installation tool 10") for properly installing a cruise control stop switch 11 on a brake pedal 13 (see FIGS. 5 and 6) of an automotive vehicle. During installation of the cruise control stop switch 11, the installation tool 10 communicates with a cruise control stop circuit inside the vehicle to determine if the cruise control stop switch 11 is installed correctly, as will be explained further below. The installation tool 10 is cylindrical in shape and includes a main body 12, a power source 14, multiple indicators comprising a green LED 16 and a red LED 18, a locking device 20, a detachable top portion 22, and a removable coupler 24.

The main body 12 has an open top 26 and a closed bottom 28. In the embodiment shown in the figures, the main body 12 has a cylindrical shape. It should be noted, however, that the main body 12 can have any shape, such as but not limited a square shape, rectangular shape, oval shape, etc. For the purposes of illustration only, however, the main body 12 will be described as having a cylindrical shape, as shown in the figures.

The main body 12 is adapted to receive a first end 29 of the power source 14, which powers the installation tool 10, via the open top 26. Specifically, the power source 14 supplies power to either the green LED 16 or the red LED 18, as will be explained further below. The power source may be any power source commonly known in the art, such as but not limited battery power, electric power, etc. In the embodiment shown in the figures, the power source 14 is a battery pack that may include rechargeable or non-rechargeable batteries.

Figure 2:
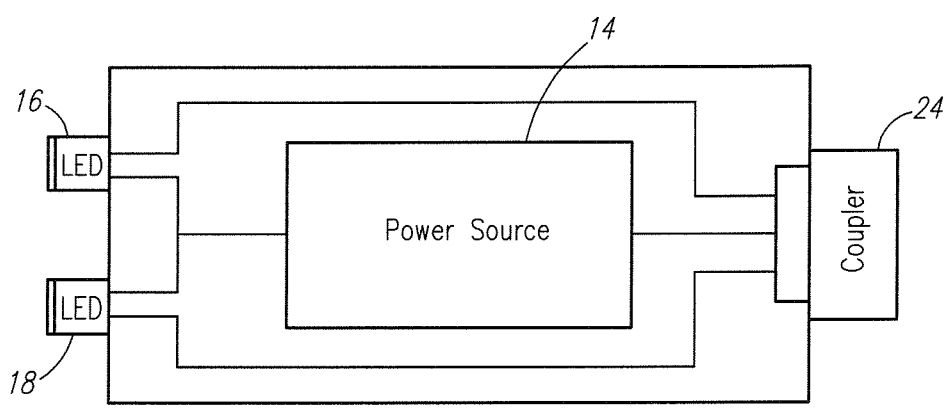
FIG. 2 is a schematic of the cruise control stop switch installation tool of FIG. 1.

The green 16 and red 18 LED's are mounted on an outer surface 30 of the main body 12 and are electrically connected to the power source 14 and the coupler 24, as shown in FIG. 2. The green 16 and red 18 LED's are mounted such that when the cruise control stop switch 11 is being installed onto the brake pedal the green 16 and red 18 LED's are facing such that the installer can clearly identify the illuminated LED.

The top portion 22 is detachable from the main body, as shown in FIG. 4, to thereby allow the replacement of the power source 14. In the example embodiment shown in the figures, the top portion 22 has a cylindrical shape and includes an outer portion 32 and an inner portion 34. It should be noted, however, that the top portion 22 can have any shape, such as but not limited a square shape, rectangular shape, oval shape, etc. For purposes of illustration only, however, the top portion 22 will be described as having a cylindrical shape, as shown in the figures.

The outer portion 32, which has an outside diameter approximately equal to an outside diameter of the main body 12, includes a top surface 36 and a rectangular shaped recess 38 defined in the top surface 36. The recess 38 receives the coupler 24, as shown in FIG. 1.

The inner portion 34 is integrally connected to a bottom 40 of the outer portion 32 and extends away from the bottom 40, as shown in FIG. 4. The inner portion 34 has an outside diameter less than the outside diameter of the main body 12 and the outer portion 32 such that the inner portion 34 fits inside the main body 12 when the installation tool 10 is in an assembled state, as shown in FIGS. 1 and 3. The inner portion 34 includes an open bottom 42 to thereby allow the top portion 22 to receive a second end 44 of the power source 14 when the installation tool 10 is in an assembled state.

Thus, when the installation tool 10 is assembled, the first end 29 of the power source 14 is inserted into the main body 12 and the second end 44 of the power source 14 is inserted into the top portion 22. The top portion 22 is fitted to the main body 12 such that the power source 14 is completely enclosed within the installation tool 10. The top portion 22 is then secured to the main body 12 with the locking device 20. Specifically, the locking device 20 is adjusted to contact an outer surface 46 of the inner portion 34 to prevent the top portion 22 from moving thereby securing the top portion 22 to the main body 12. The locking device 20 may be any type of locking device commonly known in the art, such as but not limited to a set screw. It should be noted that the outer surface 46 of the inner portion 34 may include threads. Thus, the top portion 22 can be secured to the main body 12 by screwing the top portion 22 to the main body 12.

The coupler 24 resides in the recess 38 and is configured to receive the cruise control stop switch 11. The coupler 24 is removable from the recess 38 and simply snaps and unsnaps into and from the recess 38 respectively via a standard electrical connector (not shown). The recess 38 and hence the installation tool 10 is configured to receive a single coupler selected from a plurality of couplers, each coupler being of a different type. Each coupler from the plurality of couplers is adapted to receive a different type of cruise control stop switch for use on an associated vehicle. Thus, the coupler can be replaced with a different coupler to accommodate a different cruise control stop switch. Therefore, the installation tool 10 is flexible in that the installation tool 10 is configured to install a cruise control stop switch selected from a group of cruise control stop switches of different types whereby each different cruise control stop switch is used on an associated automotive vehicle.

Figure 5:
FIG. 5 is a view of an installer installing a cruise control stop switch with the cruise control stop switch installation tool.
Figure 6:
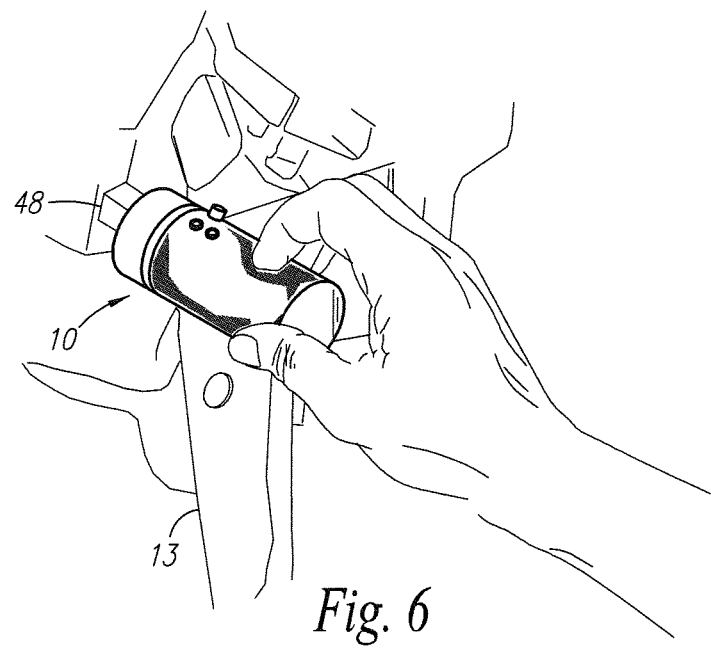
FIG. 6 is a view of an installer locking the cruise control stop switch into a retainer with the cruise control stop switch installation tool.
Figure 7:
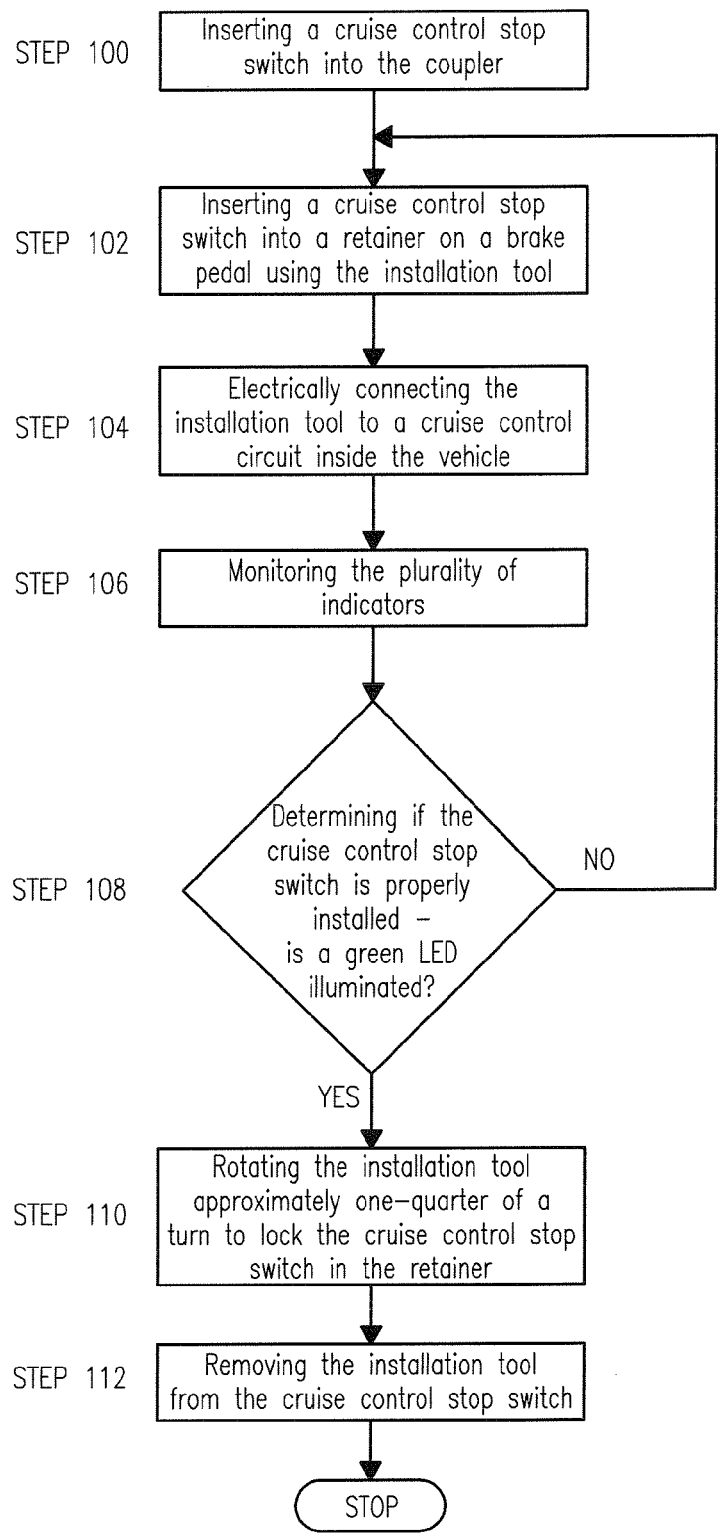
FIG. 7 is a flowchart illustrating the installation of the cruise control stop switch using the cruise control stop switch installation tool.

Referring to FIGS. 5-7, installation of the cruise control stop switch 11 will now be explained. At step 100, the cruise control stop switch 11 is inserted into the coupler 24. At this time the red LED 18 illuminates indicating that a plunger in the cruise control stop switch 11 is in an out position corresponding to an open circuit condition. At step 102, the installer, with the use of the installation tool 10, inserts the cruise control stop switch 11 into a retainer 48 located on the brake pedal 13. Because the retainer 48 is electrically connected to the cruise control stop circuit inside the vehicle, both the cruise control stop switch 11 and the installation tool 10 are also electrically connected to the cruise control stop circuit, see step 104. Thus, as mentioned above, during installation of the cruise control stop switch 11, the installation tool 10 communicates with the cruise control stop circuit inside the vehicle.

At step 108, a determination is made if the cruise control stop switch 11 is properly installed. When the cruise control stop switch 11 is correctly installed into the retainer 48, the plunger inside the cruise control stop switch 11 is pushed inward thereby closing the cruise control stop circuit. When the cruise control stop circuit is closed, the green LED 16 illuminates thereby informing the installer that the cruise control stop switch 11 is properly installed. At step 110, the installer then rotates the installation tool 10 approximately one quarter of a turn in a clockwise direction to lock the cruise control stop switch 11 into position in the retainer 48. At step 112, the installer then removes the installation tool 10 thereby leaving the cruise control stop switch 11 properly installed in the retainer 48. If at step 108 the green LED 16 is not illuminated, which means the red LED 18 is illuminated, then the cruise control stop switch 11 is not properly installed. The process returns to step 102 where the installer reinserts the cruise control stop switch 11 into the retainer 48.

Thus, the installation tool of the illustrated embodiment ensures that the cruise control stop switch is properly installed. Therefore, the installation tool ensures that the cruise control stop switch will properly disconnect the cruise control stop circuit of an automotive vehicle when the brake pedal travels a predetermined amount.

It will be appreciated that various of the above-disclosed and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method for installing a cruise control stop switch onto a brake pedal of an automotive vehicle, the method comprising:
   providing a cruise control stop switch installation tool having a power source, a recess configured to receive a coupler selected from a plurality of couplers, and a plurality of indicators;
   inserting one end of the cruise control stop switch into the coupler;
   inserting the opposite end of the cruise control stop switch into a retainer located on the brake pedal;
   electrically connecting the installation tool to a cruise control stop circuit inside the automotive vehicle;
   monitoring the plurality of indicators;
   determining if the cruise control stop switch is properly installed; and
   removing the installation tool from the cruise control stop switch.

2. The method of claim 1 further comprising rotating the installation tool in a clockwise direction to lock the cruise control stop switch into the retainer if it is determined that the cruise control stop switch is properly installed.

3. The method of claim 2, wherein the plurality of indicators includes a green LED and a red LED, and wherein the step of determining if the cruise control stop switch is properly installed comprises illuminating the green LED if the installation is proper and illuminating the red LED if the installation is improper.

* * * * *